United States Patent [19]

Littler et al.

[11] Patent Number: 4,816,960

[45] Date of Patent: Mar. 28, 1989

[54] FAIL-SAFE OUTPUT SWITCHING DEVICE

[75] Inventors: Vincent H. Littler; John D. Corrie, both of Chippenham, England

[73] Assignee: Westinghouse Brake & Signal Co., Ltd., Chippenham, England

[21] Appl. No.: 49,190

[22] Filed: May 12, 1987

Related U.S. Application Data

[63] Continuation-in-part of Ser. No. 793,619, Oct. 31, 1985, abandoned.

[30] Foreign Application Priority Data

Nov. 13, 1984 [GB] United Kingdom ............... 8428658

[51] Int. Cl.[4] .......................................... H02M 7/537
[52] U.S. Cl. .................................... 363/131; 323/239; 323/324
[58] Field of Search ............... 323/239, 324; 363/131, 363/132, 65, 63; 361/93

[56] References Cited

U.S. PATENT DOCUMENTS

| 2,809,303 | 10/1957 | Collins | 307/88 |
|---|---|---|---|
| 2,843,815 | 7/1958 | Driver | 363/22 |
| 2,929,013 | 3/1960 | McNamee | 363/121 |
| 2,946,418 | 7/1960 | Lesson, Jr. | 192/12 |
| 3,329,828 | 7/1967 | Lorentzen | 307/88 |
| 3,536,955 | 10/1970 | Sturdevant et al. | 315/24 |
| 3,558,906 | 1/1971 | Paradissis | 307/106 |
| 3,590,362 | 6/1971 | Kakalec | 363/22 |
| 3,696,285 | 10/1972 | Saia | 363/18 |
| 3,761,742 | 9/1973 | Titus et al. | 307/240 |
| 3,772,601 | 11/1973 | Smith | 328/65 |
| 3,777,248 | 12/1973 | Vermolen | 363/22 |
| 3,999,104 | 12/1976 | Lardennois | 361/88 |
| 4,016,475 | 4/1977 | Makino | 363/22 |
| 4,162,440 | 7/1979 | Lutheran | 323/239 |
| 4,279,011 | 7/1981 | Nilssen | 363/133 |
| 4,311,920 | 1/1982 | Smollinger | 307/66 |
| 4,326,133 | 4/1982 | Tasma | 307/26 |
| 4,326,236 | 4/1982 | McNair et al. | 361/170 |
| 4,369,491 | 1/1983 | Rizzi | 363/56 |
| 4,415,962 | 11/1983 | Kassakian | 363/131 |
| 4,473,732 | 9/1984 | Payne | 219/10.77 |
| 4,542,440 | 9/1985 | Chetty et al. | 361/111 |
| 4,553,070 | 11/1985 | Sairanen et al. | 315/209 R |
| 4,635,180 | 1/1987 | Nitschke | 363/132 |
| 4,646,222 | 2/1987 | Okado et al. | 363/132 |

FOREIGN PATENT DOCUMENTS

| 972130 | 10/1964 | United Kingdom . |
|---|---|---|
| 1258442 | 12/1971 | United Kingdom . |
| 1351043 | 4/1974 | United Kingdom . |

Primary Examiner—Roy N. Envall, Jr.
Assistant Examiner—Jeffery A. Gaffin
Attorney, Agent, or Firm—Nilsson, Robbins, Dalgarn, Berliner, Carson & Wurst

[57] ABSTRACT

A circuit arrangement for providing in a fail-safe manner an alternating output signal to a load, e.g. in a railway signalling system. The load is connected across a first winding of a transformer, to opposite ends of a second winding of which transformer is connected a bi-directional current switching circuit. First and second modulated signal sources are connected to the bi-directional switching circuit. Each of the signal sources modulates a carrier signal with a modulation signal, the outputs of the signal sources being out of phase with respect to each other. The bi-directional switching circuit is operative to switch current through the second winding alternately in opposite directions at the frequency of the modulation signal. The circuit arrangement is such that if any of its components fails to operate correctly, the output appearing across the first winding is no greater than a threshold level.

7 Claims, 1 Drawing Sheet

U.S. Patent    Mar. 28, 1989    4,816,960
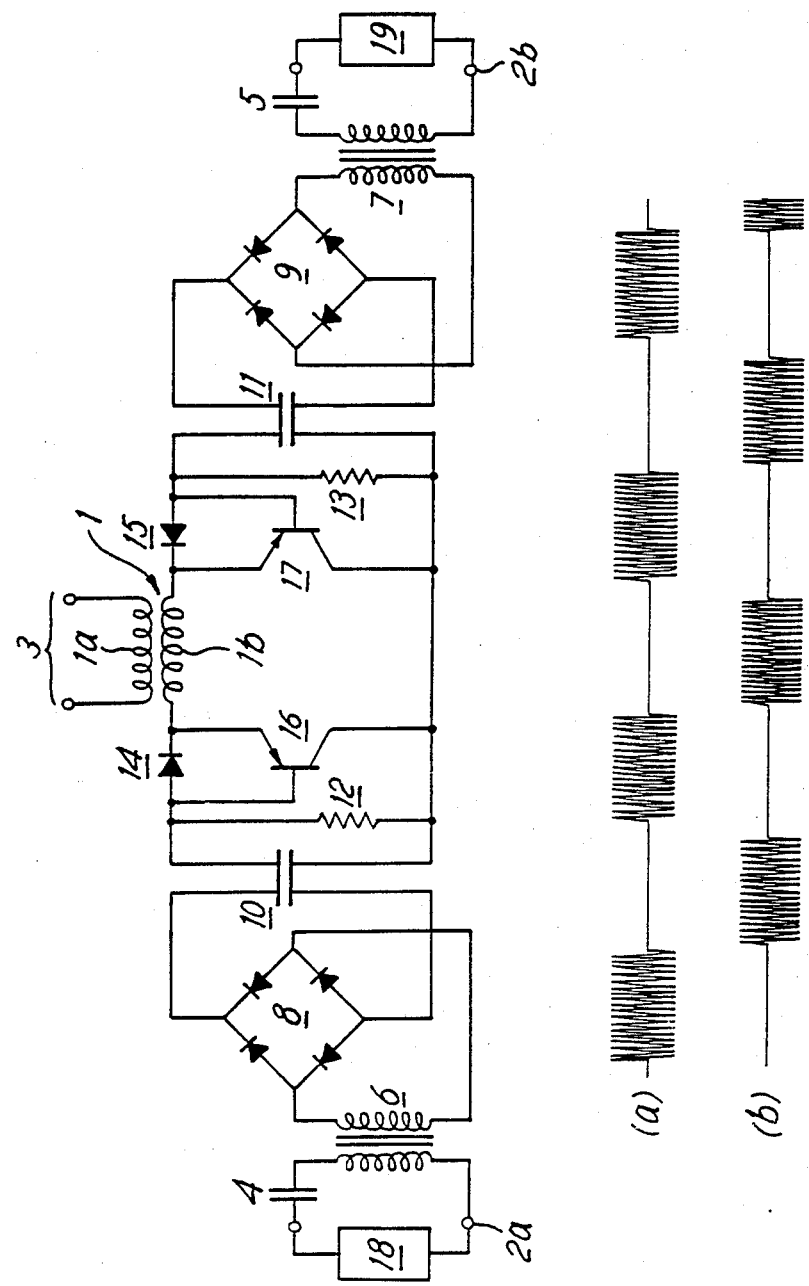

FAIL-SAFE OUTPUT SWITCHING DEVICE

This is a continuation-in-part of U.S. application Ser. No. 06/793,619 filed by the present inventors on Oct. 31, 1985 and abandoned on July 16, 1987.

The present invention relates to a circuit arrangement for providing in a fail-safe manner an alternating output signal to a load. Such an arrangement may be used in a railway signalling system to provide a control signal for safety equipment and which, in the event of component failure, must not provide an erroneous output.

The invention is particularly useful in connection with switched signals occupying either of two binary states, and in which one of the states represent a vital operating state. Control equipment using such signals must be designed such that this vital state can only be attained by correct functioning and no failure state shall be able to reproduce the corresponding output state. In the described embodiment, in the context of railway signalling, a vital state represents an operating condition which, because it directly involves safety, has to be proved correct before it may be implemented.

A known output driving stage to provide an alternating ouput signal comprises a cross-coupled transistor bridge circuit in which opposite pairs of transistors are switched in anti-phase at the required AC frequency. The output signal is provided via a transformer having an input winding connected between the bridge nodes. In such an arrangement, in the event of a switching transistor failing either open circuit or short circuit, the bridge ceases to provide an output signal. However, if one or more transistors fails to a resistive mode then some current can still flow in the output branch.

According to the present invention there is provided a circuit arrangement for providing in a fail-safe manner an alternating output signal to a load, the circuit arrangement comprising:

(a) a transformer having a first winding, for connection across the load, and a second winding;

(b) first and second modulated signal sources, each of which provides at a respective output a signal modulated in accordance with an alternating modulation signal, the modulated signal provided by the first signal source being out of phase with respect to the modulated signal provided by the second signal source; and (c) a bi-directional current switching circuit connected to opposite ends of the said second winding to switch current in opposite directions through the second winding, the bi-directional current switching circuit comprising:

(i) first and second coupling means coupled respectively with the outputs of the said first and second signal sources;

(ii) first and second controllable switching devices, each connected with one end of the said second winding, the first switching device being connected with an output of the said first coupling means so that the first signal source provides control current for the said first switching device via the said first coupling means; and (iii) third and fourth controllable switching devices, each connected with the opposite end of the said second winding, the third switching device being connected with an output of the said second coupling means so hat the said second signal source provides control current for the said third switching device via the said second coupling means;

(iv) the circuit arrangement being such that: if the said first switching device is conductive in response to current from the first coupling means, the said second and third switching devices are non-conductive and the said fourth switching device is conductive, current being switched in a first direction, from the said first coupling means and via the the first switching device, through the said second winding and the said fourth switching device, whereas if the said third switching device is conductive in response to current from the said second coupling means, the said fourth and first switching devices are non-conductive and the said second switching device is conductive, current being switched, in the opposite direction to the said first direction, from the said second coupling means and via the said third switching device, through the said second winding and the said second switching device, so that current through the said second winding is switched alternately in opposite directions at the frequency of the modulation signal; and if any component of the circuit arrangement fails to operate correctly, the output appearing across the said first winding of the transformer is not greater than a threshold level.

Preferably, the said threshold is 10% of the output appearing across the first winding of the said transformer if no component of the circuit arrangement fails to operate correctly.

The present invention will now be described, by way of example only, with reference to the accompanying drawing which shows a schematic circuit diagram of a preferred arrangement.

Referring to the drawing, there is illustrated a schematic circuit diagram of a fail-safe output switching circuit arrangement having a double ended output branch connected at opposite ends to a bi-directional switching circuit. The output branch comprises a transformer 1, the secondary winding 1a of which is connected to output terminals which has a load 3 connected across it to receive the switched output signal. The load 3 comprises a vital safety circuit of a railway signalling system. Each end of the primary winding 1b of the transformer 1 is connected to an identical half of the bi-directional switching circuit.

Input signals received at input terminals 2a and 2b of the bi-directional switching circuit pass through respective ones of capacitive-inductive high-pass filter sections, each comprising a respective one of series capacitors 4 and 5 and a respective one of transformers 6 and 7. The output of each of the filters is connected to the input terminals of a respective one of rectifier bridges 8 and 9, in each case the bridge output nodes being connected to terminals on opposite electrodes of a respective one of four terminal capacitors 10 and 11. A respective one of bleed resistors 12 and 13 is connected between the remaining terminals of each of the capacitors 10 and 11 to provide a shunt discharge path for the capacitor. Transistors 16 and 17, each connected in a common-collector configuration in combination with a respective one of diodes 14 and 15, are connected to opposite ends of winding 1b, the transistors and the diodes acting as controllable switching devices operative to provide alternating current through the winding 1b of the transformer 1.

The input terminals 2a and 2b of the two halves of the bi-directional switching circuit are connected respectively to the outputs of a pair of amplitude modulated signal generators schematically represented by blocks 18, 19. These generators provide anti-phase output signals at input terminals 2a and 2b respectively, as illustrated at (a) and (b) respectiveley. In the generators 18 and 19, the output signals are produced by using anti-phase versions respectively of a control signal to amplitude modulate in each case a carrier signal of a relatively higher frequency wave form, to provide amplitude modulated output signals.

In operation of the circuit arrangement described above, the input signal at each of the terminals 2a and 2b may be generated (as a result of a signal applied externally of the circuit arrangement to the respective one of generators 18 and 19) for one of several purposes, for example as a railway track circuit transmitter signal; as a dynamic output control signal; or as a signal representing the operative state of a traffic control device. In each of the generators 18 and 19, the relatively higher frequency carrier signal is amplitude modulated by a respective one of the anti-phase versions of the control signal, and the anti-phase modulated signals are connected respectively to the input terminals 2a and 2b. The signals pass through the high pass filters 4, 6 and 5, 7 to the rectifier bridges 8 and 9, whose outputs charge capacitors 10 and 11 respectively. The voltages on capacitors 10 and 11 tend to follow the voltage wave form of the control (modulation) signal (the rectifier bridges 8 and 9 and the capacitors 10 and 11 acting as demodulators) and alternately forward bias diodes 14 and 15 and transistors 16 and 17. The arrangement is such that: when diode 14 is forward biased in one half cycle, transistor 17 is switched into conduction to provide a current path from capacitor 10 through diode 14, primary winding 1b of transformer 1 and transistor 17; and when diode 15 is forward biased in the next half cycle, transistor 16 is commutated into conduction to provide a current path from capacitor 11 through diode 15, primary winding 1b and transistor 16. The effect is to produce an alternating current through the primary winding 1b which is in accordance with the original control signal.

The resistors 12 and 13 provide discharge paths for the capacitors 10 and 11 respectively when the adjacent one of the transistors 16 and 17 is switched to a conducting state. Four terminal capacitors are preferred to prevent the relatively higher frequency components of the modulated signals reaching the primary winding 1b in the event that a capacitor connection fails to open circuit.

To achieve full output current drive into the transformer 1, both halves of the circuit arrangement (that is both halves of the bi-directional switching circuit and both generators 18 and 19) must function correctly. In the event that one of the halves of the circuit arrangement ceases to function normally due to component failure, some output current will still be provided, however. The level of output produced in such circumstances is generally determined by the ratio of input impedance to output impedance. In the circuit arrangement illustrated, the output impedance is the total impedance of the transformer input winding 1b including reflected impedance of the secondary winding and load. Similarly, the input impedance is the total impedance of the input winding of transformer 6 or 7 including reflected impedances. In the present example, these impedances are arranged such that no more than a threshold of about 10% of full normal output (i.e. when no component of the circuit arrangement fails to operate correctly) can appear across the winding 1a in the event of any component failure, so that the load (for example a relay winding across the winding 1a is not energised or is de-energised in the event of any component failure.

Preferably, the source impedances, that is of the generators 18 and 19, are equal in order to produce an evenly balanced output, and also are proof against low resistance in order to guarantee the integrity of the threshold properties of the output.

We claim:

1. A railway signalling system including a load and a circuit arrangement for providing in a fail-safe manner an alternating output signal to the load, the circuit arrangement comprising:
   (a) a transformer having a first winding, connected across the load, and a second winding;
   (b) first and second modulated signal sources. each of which provides at a respective output a signal modulated in accordance with an alternating modulation signal, the modulated signal provided by the first signal source being out of phase with respect to the modulated signal provided by the second signal source; and
   (c) a bi-directional current switching circuit connected to opposite ends of the said second winding to switch current in opposite directions through the second winding, the (c) bi-directional current switching circuit comprising:
     (i) first and second coupling means coupled respectively with the outputs of the said first and second signal sources;
     (ii) first and second controllable switching devices, each connected with one end of the said second winding, the first switching device second winding, the first switching device being connected with an output of the said first coupling means so that the said first signal source provides control current for the said first switching device via the said first coupling means; and
     (iii) third and fourth controllable switching devices, each connected with the opposite end of the said second winding, the third switching device being connected with an output of the said second coupling means so that the said second signal source provides control current for the said third switching device via the said second coupling means;
     (iv) the circuit arrangement being such that: if the said first switching device is conductive in response to current from the first coupling means, the said second and third switching devices are non-conductive and the said fourth switching device is conductive, current being switched in a first direction, from the said first coupling means and via the first switching device, through the said second winding and the said fourth switching device, whereas if the said third switching device is conductive in response to current from the said second coupling means, the said fourth and first switching devices are non-conductive and the said second switching device is conductive, current being switched, in the opposite direction to the said first direction, from the said second coupling means and via the said third switching device, through the said second winding and the said second switching device, so that current through the said second winding is switched alternately in opposite directions at the frequency of the modulation signal; and if any component of the circuit arrangement fails to operate correctly, the output appearing across the said first winding of the transformer is not greater than a threshold level.

2. A railway signalling system according to claim 1, wherein each of the said first and second modulated signal sources provides at its output a modulated signal by modulating, at the frequency of the modulation signal, an alternating signal having a frequency higher than the modulation signal.

3. A railway signalling system according to claim 1, wherein the said first and second coupling means comprise first and second demodulation means.

4. A railway signalling system according to claim 3, wherein each of the said first and second demodulation means respectively comprises capacitive means and rectifier means, the capacitive means being coupled with the output of the respective one of the said first and second modulated signal sources via the rectifier means.

5. A railway signally system according to claim 4, wherein each of said coupling means includes a transformer for coupling each of said rectifier means with the output of the respective one of the said first and second modulated signal sources.

6. A railway signalling system according to claim 1, wherein each of the said first and third switching devices comprises rspectively a diode and each of the said second and fourth switching devices comprises respectively a transistor.

7. A railway signalling system according to claim 6, wherein each of the said transistors is connected in a common collector configuration, the respective one of the said diodes being connected between its base and emitter.

* * * * *